(12) United States Patent
Asano et al.

(10) Patent No.: US 6,577,662 B1
(45) Date of Patent: Jun. 10, 2003

(54) SEMICONDUCTOR LASER, AND MANUFACTURING METHOD THEREOF, SEMICONDUCTOR DEVICE AND MANUFACTURING METHOD THEREOF

(75) Inventors: Takeharu Asano, Miyagi (JP); Masao Ikeda, Kanagawa (JP); Tsuyoshi Tojo, Miyagi (JP); Shigetaka Tomiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/552,498

(22) Filed: Apr. 19, 2000

(30) Foreign Application Priority Data

Apr. 23, 1999 (JP) .............................. 11-116804

(51) Int. Cl.$^7$ ................................ H01S 5/22
(52) U.S. Cl. ........................................ 372/46
(58) Field of Search ............................... 372/44, 45, 46

(56) References Cited

U.S. PATENT DOCUMENTS 5,822,350 A * 10/1998 Nishimura et al. ........... 372/46

* cited by examiner

*Primary Examiner*—James Davie
(74) *Attorney, Agent, or Firm*—Sonnenschein, Nath & Rosenthal

(57) ABSTRACT

In a semiconductor laser having a ridge-shaped stripe and made of nitride III-V compound semiconductors, opposite sides of the ridge are buried with a buried semiconductor layer of $Al_xGa_{1-x}As$ ($0<x\leq1$), $(Al_xGa_{1-x})_yIn_{1-y}P$ ($0\leq x\leq1$, $0\leq y\leq1$) or $Zn_xMg_{1-x}S_ySe_{1-y}$ ($0\leq x\leq1$, $0\leq y\leq1$) to stably control transverse modes, thereby minimizing higher mode oscillation during a high power output, and improving the heat dissipation property.

12 Claims, 10 Drawing Sheets

SEMICONDUCTOR LASER, AND MANUFACTURING METHOD THEREOF, SEMICONDUCTOR DEVICE AND MANUFACTURING METHOD THEREOF

RELATED APPLICATION DATA

The present application claims priority to Japanese Application No. P11-116804 filed Apr. 23, 1999, which application is incorporated herein by reference to the extent permitted by law.

BACKGROUND OF THE INVENTION

1. Field of the Invention

This invention relates to a semiconductor laser, its manufacturing method, semiconductor device and its manufacturing method, especially suitable for use in a ridge—structured semiconductor laser using nitride III-compound semiconductors.

2. Description of the Related Art

Vigorous researches and developments have been made in recent years about semiconductor lasers using nitride III-V compound semiconductors like AlGaInN as being semiconductor lasers capable of emitting light over the blue to ultraviolet regions necessary for realization of higher density of optical discs. In order to realize write type optical discs, optical power at least not less than 20 mW is required. A group of Nakamura et al. reported about fabrication of a high power laser using these kinds of material (Appl. Phys. Lett., 72(1998) 2014, Jpn. J. Appl. Phys., 37(1998)L627). This semiconductor laser has a ridge-shaped stripe, side surfaces of the ridge are protected by an insulating film such as $SiO_2$, and its p-side electrode is configured to contact only the part of a p-type contact layer on the top surface of the ridge.

The reported semiconductor laser has practical problems, namely, exhibiting kinks in its optical output-electric current property and an increase of the current immediately after the power supply. Kinks demonstrate that higher mode oscillation occurs along with an increase of the optical output. To suppress it, it is necessary to decrease the. difference in refractive index between the ridge portion and the portion outside the ridge or reduce the stripe width. In this case, however, the portion outside the ridge is $SiO_2$ or air having a small refractive index. Therefore, it is not easy to change the difference of refractive indices. Reducing the stripe width is attended with difficulties in the process.

On the other hand, the increase of the current immediately after the power supply is considered to be induced by thermal deterioration of the active layer. To prevent it, it is necessary to effectively discharge the heat generated in the active layer. In this structure of the semiconductor laser, however, since the portion of the ridge top surface other than the p-type contact layer surface is covered by $SiO_2$ having a low heat conductivity, it is difficult to dissipate the heat.

SUMMARY OF THE INVENTION

It is therefore an object of the invention to provide a semiconductor laser capable of suppressing higher mode oscillation during high power output by stably controlling transverse modes and excellent in heat dissipation property, and a manufacturing method thereof.

Another object of the invention is to provide a semiconductor device excellent in heat dissipation property and having a long lifetime, and a manufacturing method thereof.

According to the first aspect of the invention, there is provided a semiconductor laser having a ridge-shaped stripe and made by using nitride III-V compound semiconductors, comprising:

a buried layer made of $Al_xGa_{1-x}As$ ($0 \leq x1$) to bury opposite sides of the ridge-shaped stripe.

According to the second aspect of the invention, there is provided a semiconductor laser having a ridge-shaped stripe and made by using nitride III-V compound semiconductors, comprising:

a buried layer made of $(Al_xGa_{1-x})_yIn_{1-x}P$ ($0 \leq x \leq 1$, $0 \leq y \leq 1$) to bury opposite sides of the ridge-shaped stripe.

According to the third aspect of the invention, there is provided a semiconductor laser having a ridge-shaped stripe and made by using nitride III-V compound semiconductors, comprising:

a buried layer made of $Zn_xMg_{1-x}S_ySe_{1-y}$ ($0 \leq x \leq 1$, $0 \leq y \leq 1$) to bury opposite sides of the ridge-shaped According to the fourth aspect of the invention, there is provided a method for manufacturing a semiconductor laser having a ridge-shaped stripe and made by using nitride III-V compound semiconductors, comprising the steps of:

making the ridge-shaped stripe; and growing a buried semiconductor layer made of $Al_xGa_{1-x}As$ ($0 \leq x \leq 1$) to bury opposite sides of the ridge-shaped stripe.

According to the fifth aspect of the invention, there is provided a method for manufacturing a semiconductor laser having a ridge-shaped stripe and made by using nitride III-V compound semiconductors, comprising the steps of:

making the ridge-shaped stripe; and growing a buried semiconductor layer made of $(Al_xGa_{1-x})_yIn_{1-y}P$ ($0 \leq x \leq 1$, $0 \leq y \leq 1$) to bury opposite sides of the ridge-shaped stripe.

According to the sixth aspect of the invention, there is provided a method for manufacturing a semiconductor laser having a ridge-shaped stripe and made by using nitride III-V compound semiconductors, comprising the steps of:

making the ridge-shaped stripe; and growing a buried semiconductor layer made of $Zn_xMg_{1-x}S_ySe_{1-y}$ ($0 \leq x \leq 1$, $0 \leq y \leq 1$) to bury opposite sides of the ridge-shaped stripe.

According to the seventh aspect of the invention, there is provided a semiconductor device having a projection on a nitride III-V compound semiconductor base body, comprising:

a buried semiconductor layer made of $Al_x Ga_{1-x}As$ ($0 \leq x \leq 1$) to bury a portion around the projection.

According to the eighth aspect of the invention, there is provided a semiconductor device having a projection on a nitride III-V compound semiconductor base body, comprising:

a buried semiconductor layer made of $(Al_x Ga_{1-x})_yIn_{1-y}P$ ($0 \leq x \leq 1$, $0 \leq y \leq 1$) to bury a portion around the projection.

According to the ninth aspect of the invention, there is provided a semiconductor device having a projection on a nitride III-V compound semiconductor base body, comprising:

a buried semiconductor layer made of $Zn_x Mg_{1-x}S_ySe_{1-y}$ ($0 \leq x \leq 1$, $0 \leq y \leq 1$) to bury a portion around the projection.

According to the tenth aspect of the invention, there is provided a method for manufacturing a semiconductor device having a projection on a nitride III-V compound semiconductor base body and including a buried semiconductor layer made of $Al_xGa_{1-x}As$ ($0 \leq x \leq 1$) which buries a portion around the projection, comprising the steps of:

making the projection; and growing the buried semiconductor layer made of $Al_xGa_{1-x}As$ ($0 \leq x \leq 1$) to bury the portion around the projection.

According to the eleventh aspect of the invention, there is provided a method for manufacturing a semiconductor device having a projection on a nitride III-V compound semiconductor base body and including a buried semiconductor layer made of $(Al_xGa_{1-x})_yIn_{1-y}P$ ($0 \leq x \leq 1$, $0 \leq y \leq 1$) which buries a portion around the projection, comprising the steps of:

making the projection; and growing the buried semiconductor layer made of $(Al_xGa_{1-x})_yIn_{1-y}P$ ($0 \leq x \leq 1$, $0 \leq y \leq 1$) to bury the portion around the projection.

According to the twelfth aspect of the invention, there is provided a method for manufacturing a semiconductor device having a projection on a nitride III-V compound semiconductor base body and including a buried semiconductor layer made of $Zn_xMg_{1-x}S_ySe_{1-y}$ ($0 \leq x \leq 1$, $0 \leq y \leq 1$) which buries a portion around the projection, comprising the steps of:

making the projection; and growing the buried semiconductor layer made of $Zn_xMg_{1-x}S_ySe_{1-y}$ ($0 \leq x \leq 1$, $0 \leq y \leq 1$) to bury the portion around the projection.

In the present invention, all of the buried semiconductor layer made of $Al_xGa_{1-x}As$ ($0 \leq x \leq 1$), buried semiconductor layer made of $(Al_xGa_{1-x})_yIn_{1-y}P$ ($0 \leq x \leq 1$, $0 \leq y \leq 1$) and buried semiconductor layer made of $Zn_xMg_{1-x}S_ySe_{1-y}$ ($0 \leq x \leq 1$, $0 \leq y \leq 1$) have the [111] orientation. For growth of these buried semiconductor layers, metal organic chemical vapor deposition (MOCVD) and molecular epitaxy (MBE) are usable. However, in case of selectively growing a buried semiconductor layer on opposite sides of the ridge-shaped stripe or around the projection, metal organic chemical vapor deposition is preferably used. When metal organic chemical vapor deposition is used for the growth, the growth temperature is typically set at 600° C. through 900° C. for the buried semiconductor layer of $Al_xGa_{1-x}As$ ($0 \leq x \leq 1$), 500° C. through 800° C. for the buried semiconductor layer of $(Al_xGa_{1-x})_yIn_{1-y}P$ ($0 \leq x \leq 1$) and 300° C. through 600° C. for the buried semiconductor layer of $Zn_xMg_{1-x}S_ySe_{1-y}$ ($0 \leq x \leq 1$, ($0 \leq y \leq 1$)). Especially when a semiconductor laser is manufactured, if an InGaN material is used as the material of the active layer, the growth temperature of the buried semiconductor layer is preferably higher than the growth temperature of the active layer for minimizing thermal deterioration of the active layer.

In the present invention, from the standpoint of simplifying the manufacturing process of a semiconductor laser or a semiconductor device and manufacturing it easier, the buried semiconductor layer is preferably grown selectively on opposite sides of the ridge-shaped stripe or around the projection. However, selective growth is not indispensable. That is, it is also possible to make the ridge-shaped stripe or the projection, then grow the buried semiconductor layer on the entire substrate surface so as to cover the ridge-shaped stripe or the projection, and thereafter remove a part of the buried semiconductor layer from above the ridge-shaped stripe or the projection by etching, for example.

In the present invention, the nitride III-V compound semiconductor includes at least one kind of group III element selected from the group consisting of Ga, Al, In, B and Tl, and group V elements which include at least N and may further include As or P under certain conditions. Specific examples of nitride III-V compound semiconductor are GaN, AlGaN, AlN, GaInN, AlGaInN, InN, and so on.

According to the semiconductor laser and its manufacturing method having the above-summarized configuration, since opposite sides of the ridge-shaped stripe are buried with the buried semiconductor layer made of $Al_xGa_{1-x}As$ ($0 \leq x \leq 1$), $(Al_xGa_{1-x})_yIn_{1-y}P$ ($0 \leq x \leq 1$, $0 \leq y \leq 1$) or $Zn_xMg_{1-x}S_ySe_{1-y}$ ($0 \leq x \leq 1$, $0 \leq y \leq 1$), heat dissipation from the ridge portion is promoted, and this minimizes deterioration of the active layer and elongates the lifetime of the semiconductor laser.

Additionally, since the buried semiconductor layer made of $Al_xGa_{1-x}As$ ($0 \leq x \leq 1$), $(Al_xGa_{1-x})_yIn_{1-y}P$ ($0 \leq x \leq 1$, $0 \leq y \leq 1$) or $Zn_xMg_{1-x}S_ySe_{1-y}$ ($0 \leq x \leq 1$, $0 \leq y \leq 1$) absorbs light emitted from the active layer, it forms a loss-guided semiconductor laser capable of stabilizing transverse modes, alleviate higher mode oscillation during high output power, and removing kinks in optical output-electric current curve. Therefore, the stripe width need not be so thin, and the laser can be manufactured easily.

Especially when using metal organic chemical vapor deposition for growth of the buried semiconductor layer made of $Al_xGa_{1-x}As$ ($0 \leq x \leq 1$), $(Al_xGa_{1-x})_yIn_{1-y}P$ ($0 \leq x \leq 1$, $0 \leq y \leq 1$) or $Zn_xMg_{1-x}S_ySe_{1-y}$ ($0 \leq x \leq 1$, $0 \leq y \leq 1$), selective growth is possible, and the semiconductor laser can be manufactured easily.

Moreover, by burying the buried semiconductor layer at a lower growth temperature than the growth temperature of the active layer, thermal deterioration of the active layer can be prevented, and a semiconductor laser having a long lifetime can be manufactured.

According to the semiconductor device and its manufacturing method having the above-summarized configuration according to the invention, since the portion around the projection is buried with the buried semiconductor layer made of $Al_xGa_{1-x}As$ ($0 \leq x \leq 1$), $(Al_xGa_{1-x})_yIn_{1-y}P$ ($0 \leq x \leq 1$, $0 \leq y \leq 1$) or $Zn_xMg_{1-x}S_ySe_{1-y}$ ($0 \leq x \leq 1$, $0 \leq y \leq 1$), in the case where the projection becomes a heat generating source, heat dissipation from the ridge portion is promoted, and this minimizes deterioration of the device and elongates the lifetime of the semiconductor device.

Especially when using metal organic chemical vapor deposition for growth of the buried semiconductor layer made of $Al_xGa_{1-x}As$ ($0 \leq x \leq 1$), $(Al_xGa_{1-x})_yIn_{1-y}P$ ($0 \leq x \leq 1$, $0 \leq y \leq 1$) or $Zn_xMg_{1-x}S_ySe_{1-y}$ ($0 \leq x \leq 1$, $0 \leq y \leq 1$), selective growth is possible, and the semiconductor device can be manufactured easily.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
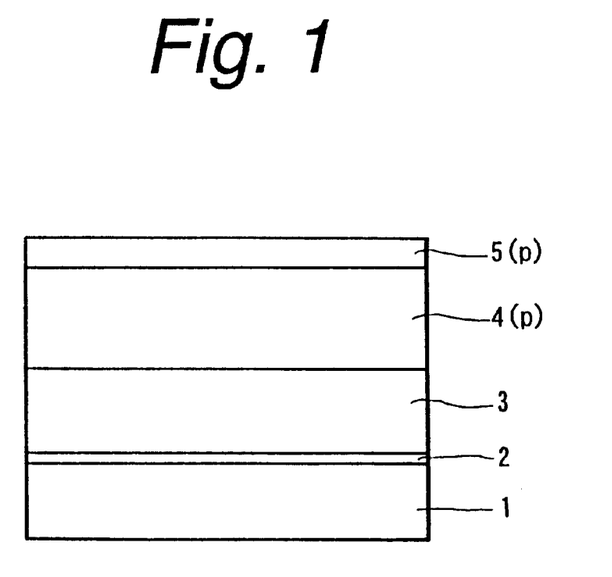
FIG. 1 is a cross-sectional view for explaining a method for preparing a sample used in a preparatory experiment.
Figure 2:
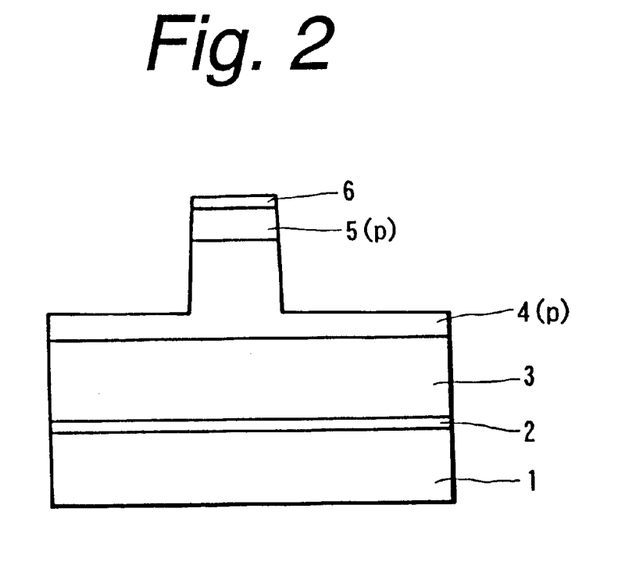
FIG. 2 is a cross-sectional view for explaining a method for preparing a sample used in a preparatory experiment.
Figure 3:
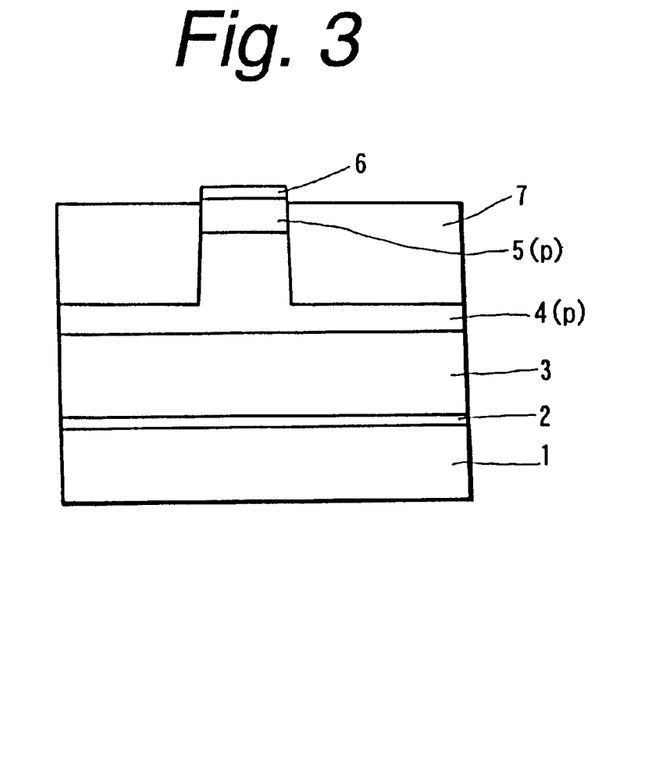
FIG. 3 is a cross-sectional view for explaining a method for preparing a sample used in a preparatory experiment.

Before start ing explanation of embodiments, explanation is made about a result of a preparatory experiment conducted to evaluate the burying characteristics by the buried layer and the crystallographic property of the buried layer. FIGS. 1 through 3 show a method for preparing a sample for evaluation.

First as shown in FIG. 1, on a c-plane sapphire substrate 1 whose surface is previously cleaned by thermal cleaning, for example, an undoped GaN buffer layer 2 is grown by MOCVD at a temperature around 520° C., for example. Thereafter, an undoped GaN layer 3, p-type AlGaN layer 4 and p-type GaN layer 5 are sequentially grown on the GaN buffer layer 2 by MOCVD at the growth temperature of 1000° C. Used as source materials for growth of these GaN semiconductor layers are, for example, trimethyl gallium $((CH_3)_3Ga$, TMG) as the source material of a group III element, Ga, trimethyl aluminum $((CH_3)_3Al$, TMA) as the source material of a group III element, Al, trimethyl indium $((CH_3)_3In$, TMI) as the source material of a group III element, In, and ammonium $(NH_3)$ as the source material of a group V element, N. Used as the carrier gas is a mixed gas of hydrogen $(H_2)$ and nitrogen $(N_2)$, for example. Used as the p-type dopant is bis-methyl cyclopentadienile magnesium $((CH_3C_5H_4)_2Mg)$ or bis-cyclopentadienile magnesium $((C_5H_5)_2Mg)$, for example.

Next, the c-plane sapphire substrate 1 having the GaN semiconductor layers grown therein is taken out from the MOCVD apparatus. Next, as shown in FIG. 2, a $SiO_2$ film 6 having the thickness of 0.4 μm, for example, is stacked on the entire surface of the p-type GaN layer 5 by CVD, vacuum evaporation or sputtering, for example. Thereafter, a resist pattern (not shown) of a predetermined pattern is formed on the $SiO_2$ film 6 by lithography, and using the resist pattern as a mask, the $SiO_2$ film 6 is etched into the form of a stripe by wet etching using an etchant based on fluoric acid, for example, or reactive ion etching (RIE) using an etching gas containing fluorine such as $CF_4$, or $CHF_3$, for example. After that, using the $SiO_2$ film 6 as a mask, etching is conducted to a predetermined depth in the thickness direction of the p-type AlGaN layer 4 by RIE, for example, to make a ridge portion. Used as the etching gas of RIE is a chlorine-based gas, for example.

Next as shown in FIG. 3, again by MOCVD fixing the growth temperature at 670° C., for example, a GaAs buried layer 7 is grown to bury opposite sides of the ridge portion.

Figure 4:
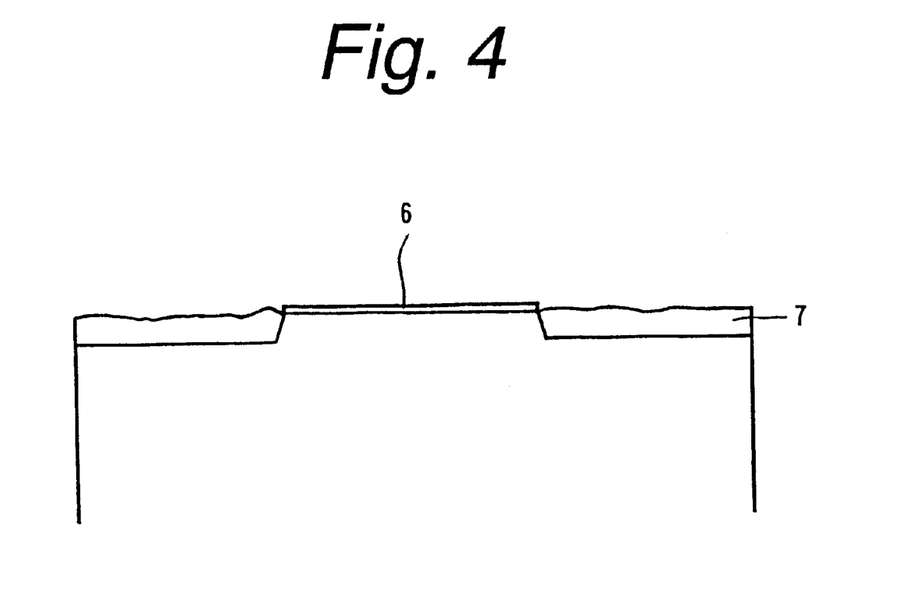
FIG. 4 is a cross-sectional view of a GaAs buried layer in a ridge portion and its vicinity in the case where the GaAs buried layer is grown fixing the growth temperature at 670° C.

FIG. 4 is a diagram drawn on the basis of a photograph of a cross-sectional surface of the GaAs buried layer in the ridge portion and its vicinity taken by scanning type electronic microscopy (SEM) from a sample having the GaAs buried layer 7 grown in the process already explained. As apparent from FIG. 4, GaAs was not grown on the SiO2 film 6. That is, selective growth was attained. It was also confirmed from the electron beam diffraction diagram that the GaAs buried layer 7 certainly had the [111] orientation.

Now explained below are embodiments of the invention with reference to the drawings. In all of the drawings illustrating the embodiments, the same or equivalent components are labeled with common reference numerals.

Figure 5:
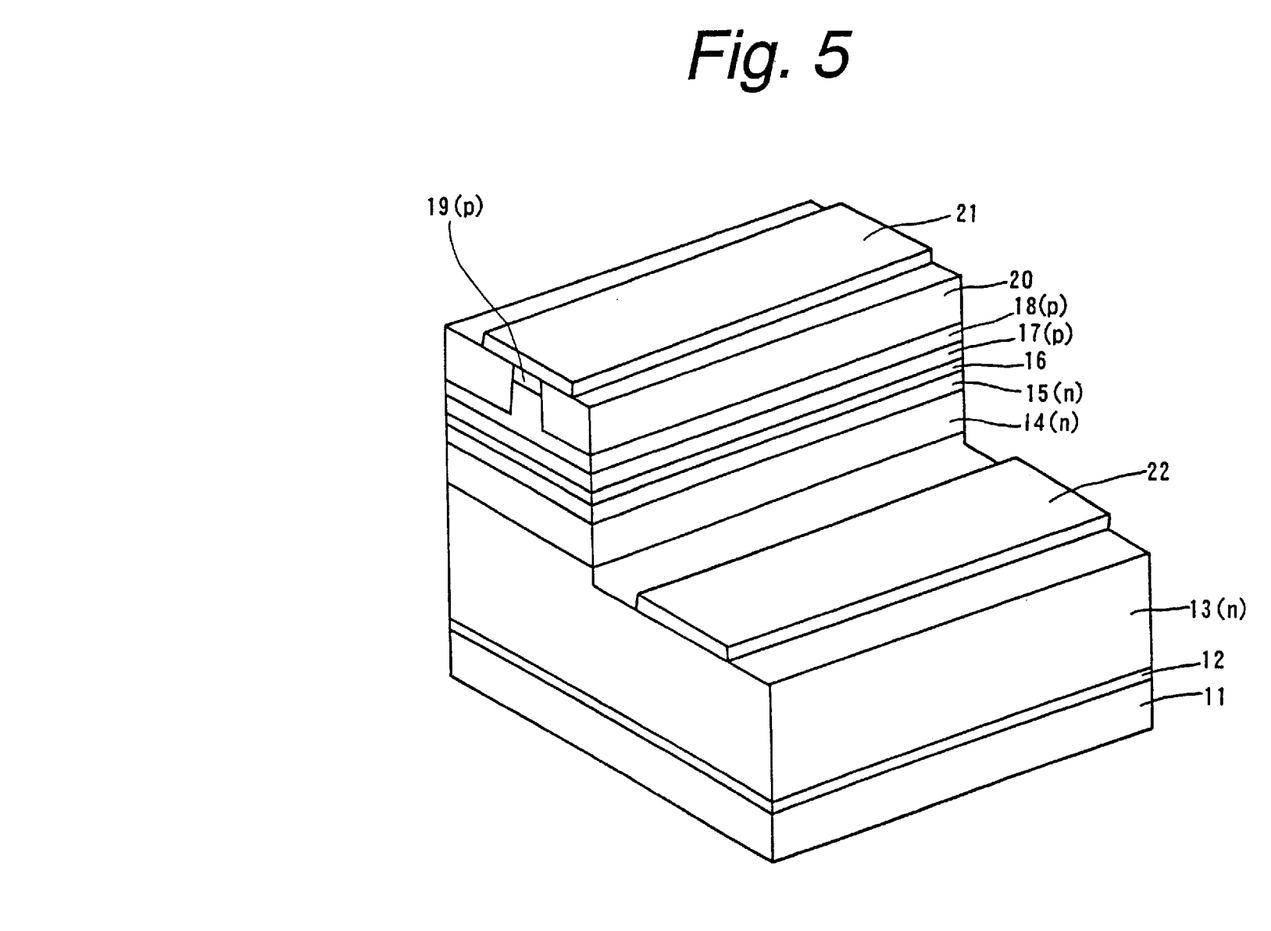
FIG. 5 is a perspective view showing a GaN semiconductor laser having a buried ridge structure according to the first embodiment of the invention.

FIG. 5 shows a GaN semiconductor laser having a buried ridge structure according to the first embodiment of the invention. This GaN semiconductor laser has a SCH (Separate Confinement Heterostructure) configuration.

As shown in FIG. 5, in the GaN semiconductor laser according to the first embodiment, on a c-plane sapphire substrate 11 having the thickness of 400 μm, for example, via an undoped GaN buffer layer 12, an n-type GaN contact layer 13, n-type AlGaN cladding layer 14, n-type GaN optical guide layer 15, active layer 16 having an undoped $Ga_{1-x}In_xN/Ga_{1-y}In_yN$ multi-quantum well structure, for example, p-type GaN optical guide layer 17, p-type AlGaN cladding layer 18 and p-type GaN contact layer 19 are sequentially stacked.

The GaN buffer layer 12 is 30 nm thick, for example. The n-type GaN contact layer 13 is 4 μm thick, for example, and doped with silicon (Si), for example, as the n-type impurity. The n-type AlGaN cladding layer 14 is 0.7 μm thick, for example, and doped with Si, for example, as the n-type impurity. The n-type GaN optical guide layer 15 is 0.1 μm thick, for example, and doped with Si, for example, as the n-type impurity. In the active layer 16 having the undoped $Ga_{1-x}In_xN/Ga_{1-y}In_yN$ multi-quantum well structure, each well layer is 3 nm thick, and each barrier layer is 4 nm thick, for example.

The p-type GaN optical guide layer 17 is 0.1 μm, for example, and doped with magnesium (Mg), for example, as the p-type impurity. The p-type AlGaN cladding layer 18 is 0.7 μm thick, for example, and doped with Mg, for example, as the p-type impurity. The p-type GaN contact layer 19 is 0.3 μm thick, for example, and doped with Mg, for example, as the p-type impurity.

The upper portion of the n-type GaN contact layer 13, n-type AlGaN cladding layer 14, n-type GaN optical guide layer 15, active layer 16, p-type GaN optical guide layer 17 and p-type AlGaN cladding layer 18 have a mesa configuration of a predetermined width. In this mesa portion, the upper portion of the p-type AlGaN cladding layer 18 and the p-type GaN contact layer 19 form a ridge portion of a predetermined width, which extends in one direction. This expending direction of the ridge portion is the <11–20> direction, for example, and the width is 4 µm, for example.

At opposite sides of the ridge portion, an undoped GaAs buried layer 20, for example, is buried. The GaAs buried layer 20 has the [111] orientation.

The p-side electrode 21 lies on the p-type GaN contact layer 19 in the ridge portion and the GaAs buried layer 20 at opposite sides thereof. The p-side electrode 21 has a Ni/Pt/Au structure made by sequentially stacking a Ni film, Pt film and Au film, for example, and these Ni film, Pt film and Au film are 10 nm thick, 100 nm thick and 300 nm thick, respectively, for example. Since the GaAs buried layer 20 has a high resistance, although the p-side electrode contacts both the p-type GaN contact layer 19 and the GaAs buried layer 20, the current flows only in the ridge stripe portion. The n-side electrode 22 lies on the n-type GaN contact layer 13 in the region adjacent to the mesa portion. This n-side electrode 22 has a Ti/Al/Pt/Au structure made by sequentially stacking a Ti film, Al film, Pt film and Au film, for example, and these Ti film, Al film, Pt film and Au film are 10 nm thick, 100 nm thick, 100 nm thick, and 300 nm thick, respectively, for example.

Next explained is a manufacturing method of the GaN semiconductor laser having the above-explained configuration according to the first embodiment of the invention.

Figure 6:
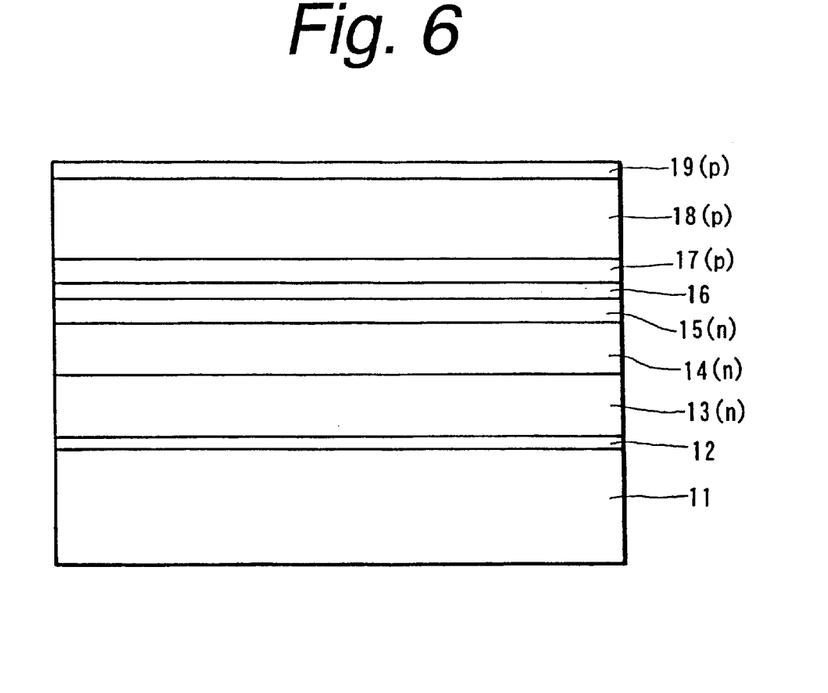
FIG. 6 is a cross-sectional view for explaining a manufacturing method of the GaN semiconductor laser having the buried ridge structure according to the first embodiment of the invention.

For manufacturing the GaN semiconductor laser, first as shown in FIG. 6, on the c-plane sapphire substrate 11 whose surface is previously cleaned by thermal cleaning, for example, the undoped GaN buffer layer 12 is grown by MOCVD at a temperature around 520° C., for example. Thereafter, the substrate temperature is raised to a predetermined growth temperature, and the n-type GaN contact layer 13, n-type AlGaN cladding layer 14, n-type GaN optical guide layer 15, active layer 16 having the undoped $Ga_{1-x}In_xN/Ga_{1-y}In_yN$ multi-quantum well structure, for example, p-type GaN optical guide layer 17, p-type AlGaN cladding layer 18 and p-type GaN contact layer 19 are sequentially stacked. For growth of the layers not containing In, namely, the n-type GaN contact layer 13, n-type AlGaN cladding layer 14, n-type GaN optical guide layer 15, p-type GaN optical guide layer 17, p-type AlGaN cladding layer 18 and p-type GaN contact layer 19, the growth temperature is fixed at approximately 1000 ° C. For growth of the layer containing In, namely, the active layer 16 having the undoped $Ga_{1-x}In_xN/Ga_{1-y}In_yN$ multi-quantum well structure, the growth temperature is fixed at approximately 800° C. Used as source materials for growth of these GaN semiconductor layers are, for example, trimethyl gallium (($CH_3)_3Ga$, TMG) as the source material of a group III element, Ga, trimethyl aluminum (($CH_3)_3Al$, TMA) as the source material of a group III element, Al, trimethyl indium (($CH_3)_3In$, TMI) as the source material of a group III element, In, and ammonium ($NH_3$) as the source material of a group V element, N. Used as the carrier gas is a mixed gas of hydrogen ($H_2$) and nitrogen ($N_2$), for example. Regarding dopants, monosilane ($SiH_4$) is used as the n-type dopant, and bis-methyl cyclopentadienile magnesium (($CH_3C_5H_4)_2Mg$) or bis-cyclopentadienile magnesium (($C_5H_5)_2Mg$) is used as the p-type dopant, for example.

Figure 7:
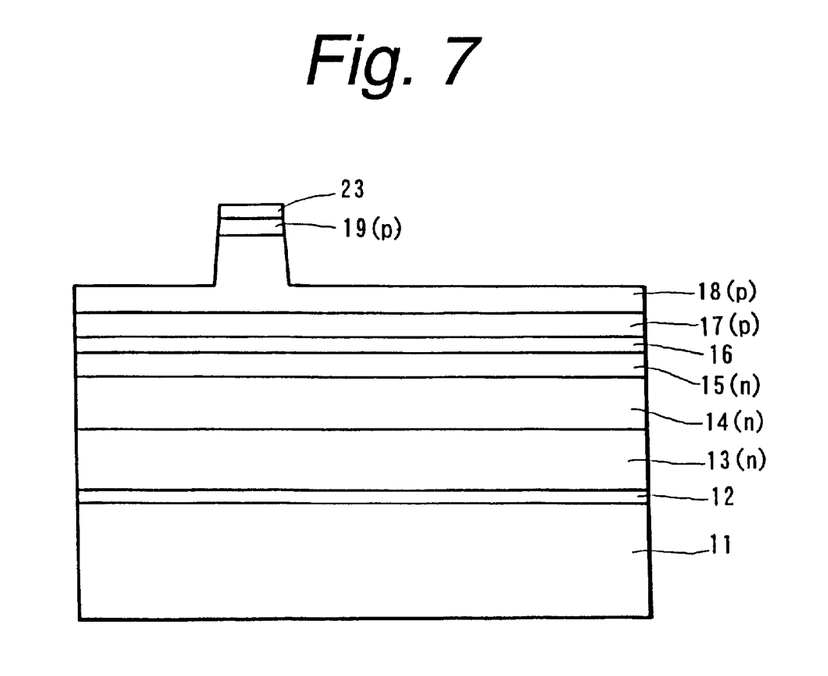
FIG. 7 is a cross-sectional view for explaining a manufacturing method of the GaN semiconductor laser having the buried ridge structure according to the first embodiment of the invention.

Next, the c-plane sapphire substrate 11 having the GaN semiconductor layers grown thereon is taken out from the MOCVD apparatus. Next, as shown in FIG. 7, the $SiO_2$ film 23 having the thickness of 0.4 µm, for example, is stacked on the entire surface of the p-type GaN contact layer 19 by CVD, vacuum evaporation or sputtering, for example. Thereafter, a resist pattern (not shown) of a predetermined pattern is formed on the $SiO_2$ film 23 by lithography, and using the resist pattern as a mask, the $SiO_2$ film 23 is etched into the form of a stripe by wet etching using an etchant based on fluoric acid, for example, or RIE using an etching gas containing fluorine such $CF_4$ or $CHF_3$, for example. After that, using the $SiO_2$ film 23 as a mask, etching is conducted to a predetermined depth in the thickness direction of the p-type AlGaN cladding layer 18 by RIE, for example, to make a ridge portion. Used as the etching gas of RIE is a chlorine-based gas, for example.

Figure 8:
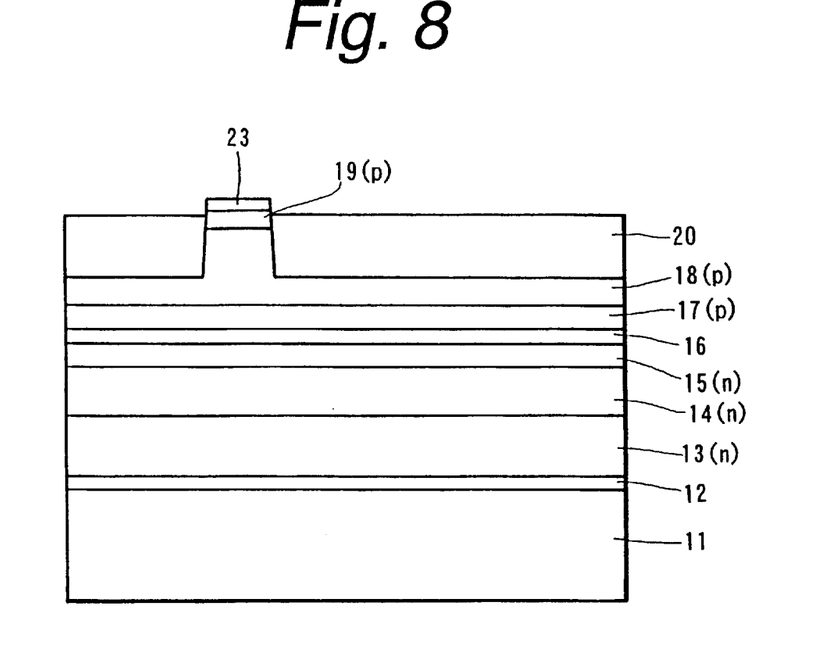
FIG. 8 is a cross-sectional view for explaining a manufacturing method of the GaN semiconductor laser having the buried ridge structure according to the first embodiment of the invention.

Next as shown in FIG. 8, again by MOCVD fixing the growth temperature at 670° C., for example, which is lower than the growth temperature of the active layer 16, the GaAs buried layer 20 is grown to bury opposite sides of the ridge portion. In this case, GaAs does not grow on the $SO_2$ film 23, and selective growth of the GaAs buried layer 20 at opposite sides of the ridge portion is possible. Used as source materials for growth of the GaAs buried layer 20 are, for example, trimethyl gallium (($CH_3)_3Ga$, TMG) as the source material of a group III element, Ga, and arsine (AsH3) as the source material of a group V element, As.

Figure 9:
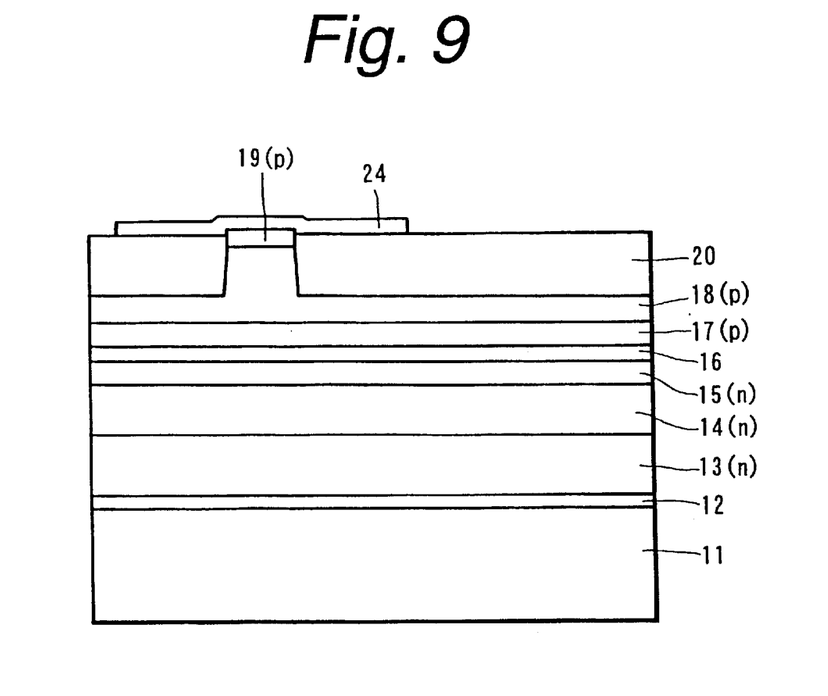
FIG. 9 is a cross-sectional view for explaining a manufacturing method of the GaN semiconductor laser having the buried ridge structure according to the first embodiment of the invention.

After that, the c-plane sapphire substrate 11 having the GaAs buried layer 20 grown thereon is taken out from the MOCVD apparatus. Then, after the $SiO_2$ film 23 is removed by etching, a $SiO_2$ film 24 having a predetermined pattern is formed on the substrate surface in the same process as explained above, as shown in FIG. 9.

Figure 10:
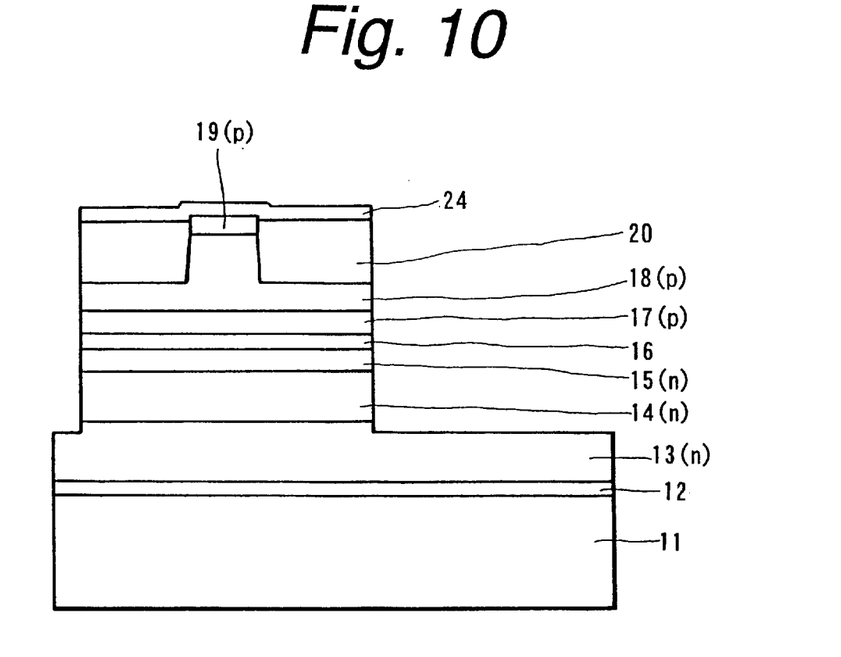
FIG. 10 is a cross-sectional view for explaining a manufacturing method of the GaN semiconductor laser having the buried ridge structure according to the first embodiment of the invention.

Next, as shown in FIG. 10, using the $SiO_2$ film 25 as a mask, etching is conducted by RIE, for example, to the depth exposing the n-type GaN contact layer 13 to pattern the upper part of the n-type GaN contact layer 13, n-type AlGaN cladding layer 14, n-type GaN optical guide layer 15, and the active layer having the undoped $Ga_{1-x}In_xN/Ga_{1-y}In_yN$ multi-quantum well structure, for example, p-type GaN optical guide layer 17, p-type AlGaN cladding layer 18 and GaAs buried layer 20 into a mesa configuration.

Figure 11:
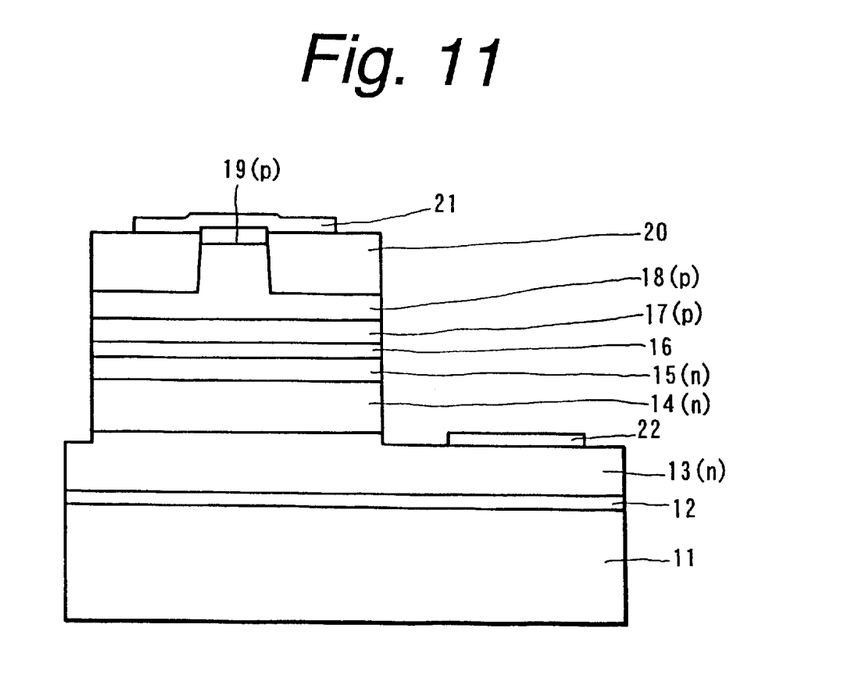
FIG. 11 is a cross-sectional view for explaining a manufacturing method of the GaN semiconductor laser having the buried ridge structure according to the first embodiment of the invention.

After that, the $SiO_2$ film 24 is removed by etching. Then, a resist pattern (not shown) having a predetermined pattern is formed on the substrate surface, and a Ti film, Al film, Pt film and Au film are sequentially stacked on the entire substrate surface by vacuum evaporation, for example. Thereafter, the resist pattern is removed together with the overlying Ti film, Al film, Pt film and Au film (lift-off). As a result, as shown in FIG. 11, the n-side electrode 22 is formed on the n-type GaN contact layer 13 in the region adjacent to the mesa portion. After that, an alloying process is conducted to bring the n-side electrode 22 into ohmic contact. In a similar process, the p-side electrode 21 is formed on the p-type GaN contact layer 19 and the GaAs buried layer 20 at opposite sides thereof in the mesa portion. Thereafter, alloying is conducted to bring the p-side electrode 21 into ohmic contact.

Next, after dividing the c-plane sapphire substrate 11 having the laser structure formed thereon into bars by cleavage, for example, to make out cavity edges, and coating the cavity edges, each bar is divided into chips by cleavage, for example. Through these steps, the intended GaN semiconductor laser having the buried ridge structure and the SCH structure as shown in FIG. 5 is obtained.

Figure 12:
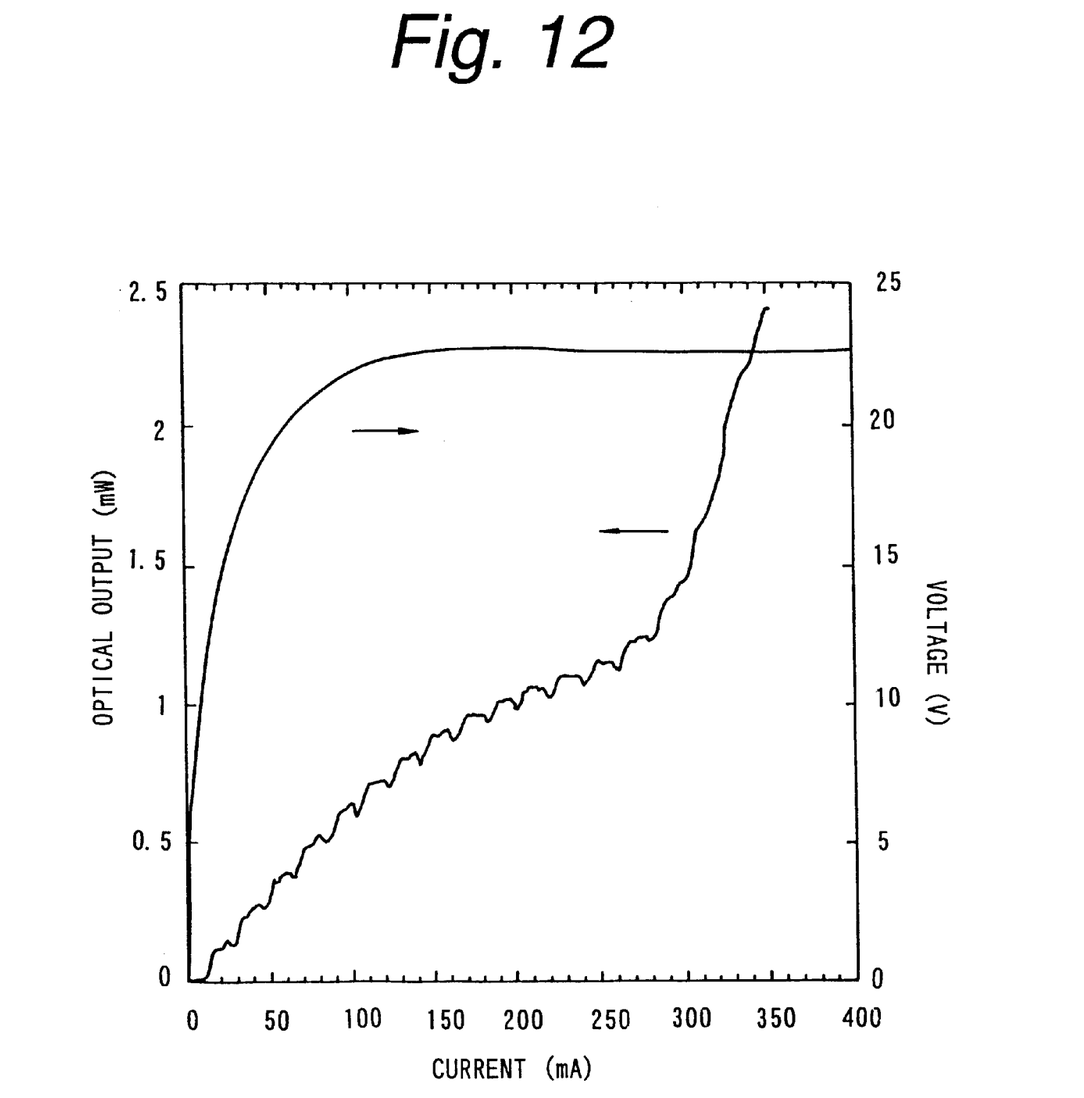
FIG. 12 is a d iagram showing a result of measurement about optical output-electric current property and voltage-current property of the GaN semiconductor laser having the buried ridge structure according to the first embodiment of the invention.

FIG. 12 shows a result of measurement about optical output-electric current property and voltage-current property of the GaN semiconductor laser according to the first embodiment. For the measurement, a current of pulses having the pulse width of 5 μsec was applied at 1 msec intervals. It is noted from FIG. 12 that, as from the current value around 280 mA, the optical output suddenly rose and laser oscillation was certainly attained.

As explained above, according to the first embodiment, since the contact area between the p-side electrode 21 and the underlying semiconductor layer can be increased by burying the ridge with the GaAs buried layer 20, it is possible to promote dissipation of heat generated during operation, thereby prevent an increase of the current while the power is supplied, and increase the lifetime of the semiconductor laser. Additionally, since the growth temperature of the GaAs buried layer 20 is lower than the growth temperature of the active layer 16, the active layer 16 is not adversely affected by heat upon the growth of the GaAs buried layer 20. Furthermore, since the band gap of the GaAs buried layer 20 is smaller than that of the active layer 16, the GaAs buried layer 20 functions as a light absorbing layer. Therefore, this semiconductor laser forms a loss-guided semiconductor laser stable in transverse modes, and can suppress higher mode oscillation upon a high output power.

Moreover, according to the first embodiment, the following advantages are obtained as well. That is, since it is the problem with growth of GaN semiconductors, in general, that p-type impurities (acceptors) in the grown layers are inactivated by hydrogen in the growth atmosphere and post-annealing in a nitrogen atmosphere is indispensable after growth of p-type layers. In the first embodiment, however, the GaAs buried layer 20 or $SiO_2$ film 23 comes to the outermost surface during growth of the GaAs buried layer 23, hydrogen in the growth atmosphere does not directly attack p-type layers, and hydrogen, which may be taken into p-type layers during the first epitaxial growth process for growing layers up to the p-type GaN contact layer 19, tends to come off through the GaAs buried layer 20 or $SiO_2$ film 23. Therefore, p-type impurities in p-type layers can be activated during growth of the GaAs buried layer 20 without the need for post-annealing.

Figure 13:
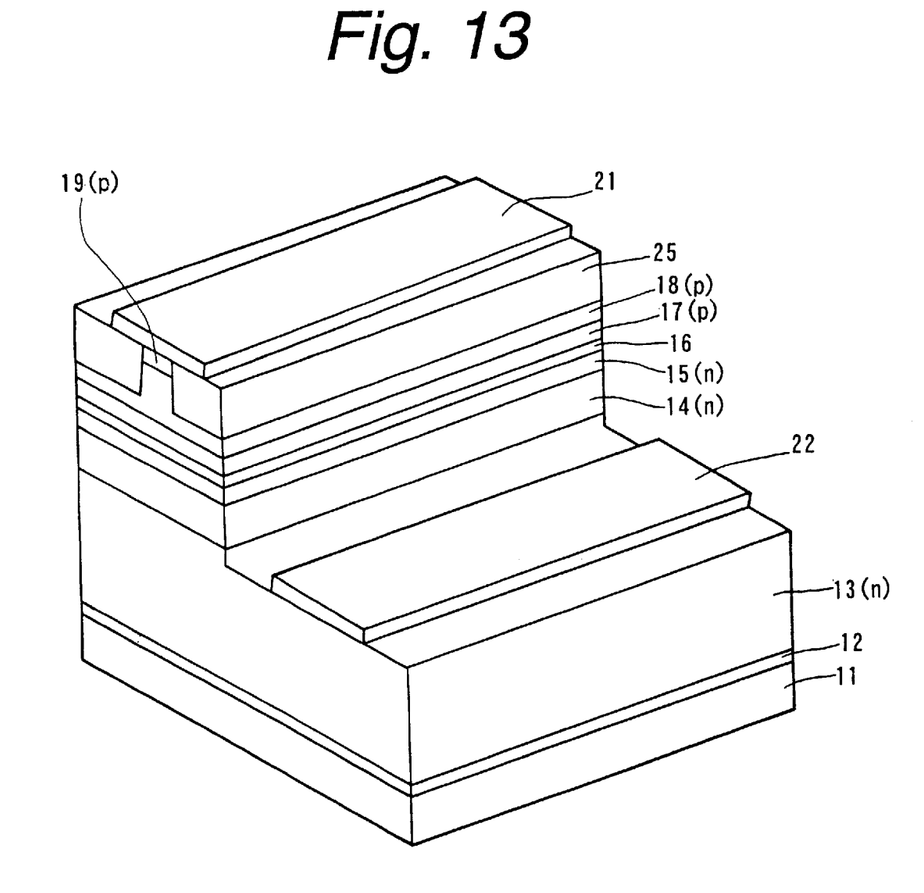
FIG. 13 is a perspective view showing a GaN semiconductor laser havingca buried ridg e structure according to the second embodiment of the invention.

FIG. 13 shows a GaN semiconductor laser having a buried ridge structure according to the second embodiment of the invention. Here again, the GaN semiconductor laser has a SCH structure.

As shown in FIG. 13, in the GaN semiconductor laser according to the second embodiment, an undoped AlGaAs buried layer 25 containing Al by 50%, for example, is buried at opposite sides of the ridge portion. The AlGaAs buried layer 25 is [111]-oriented. In the other respects, the GaN semiconductor laser shown here is the same as the first embodiment, and explanation thereof is omitted.

The GaN semiconductor laser according to the second embodiment can be manufactured by substantially the same manufacturing method used for manufacturing the GaN semiconductor laser according to the first embodiment. However, used as source materials for growth of the AlGaAs buried layer 25 are, for example, trimethyl aluminum (($CH_3)_3$Al, TMA) as the source material of a group III element, Al, trimethyl gallium (($CH_3)_3$Ga, TMG) as the source material of a group III element, Ga, and arsine ($AsH_3$) as the source material of a group V element, As.

According to the second embodiment, since the contact area between the p-side electrode 21 and the underlying semiconductor layer can be increased by burying the ridge with the AlGaAs buried layer 25, it is possible to promote dissipation of heat generated during operation, like the first embodiment, thereby prevent an increase of the current while the power is supplied, and increase the lifetime of the semiconductor laser. Additionally, since the growth temperature of the AlGaAs buried layer 25 is lower than the growth temperature of the active layer 16, the active layer 16 is not adversely affected by heat upon the growth of the AlGaAs buried layer 25. Furthermore, since the band gap of the AlGaAs buried layer 25 is smaller than that of the active layer 16, the AlGaAs buried layer 25 functions as a light absorbing layer. Therefore, this semiconductor laser forms a loss-guided semiconductor laser stable in transverse modes, and can suppress higher mode oscillation upon a high output power, especially because the difference in refractive index between the ridge portion and its outside portion can be controlled more easily by changing the Al composition of the AlGaAs buried layer 25. The second embodiment is the same as the first embodiment also in enabling activation of p-type impurities in p-type layers during growth of the AlGaAs buried layer 25 without the need for post-annealing.

Figure 14:
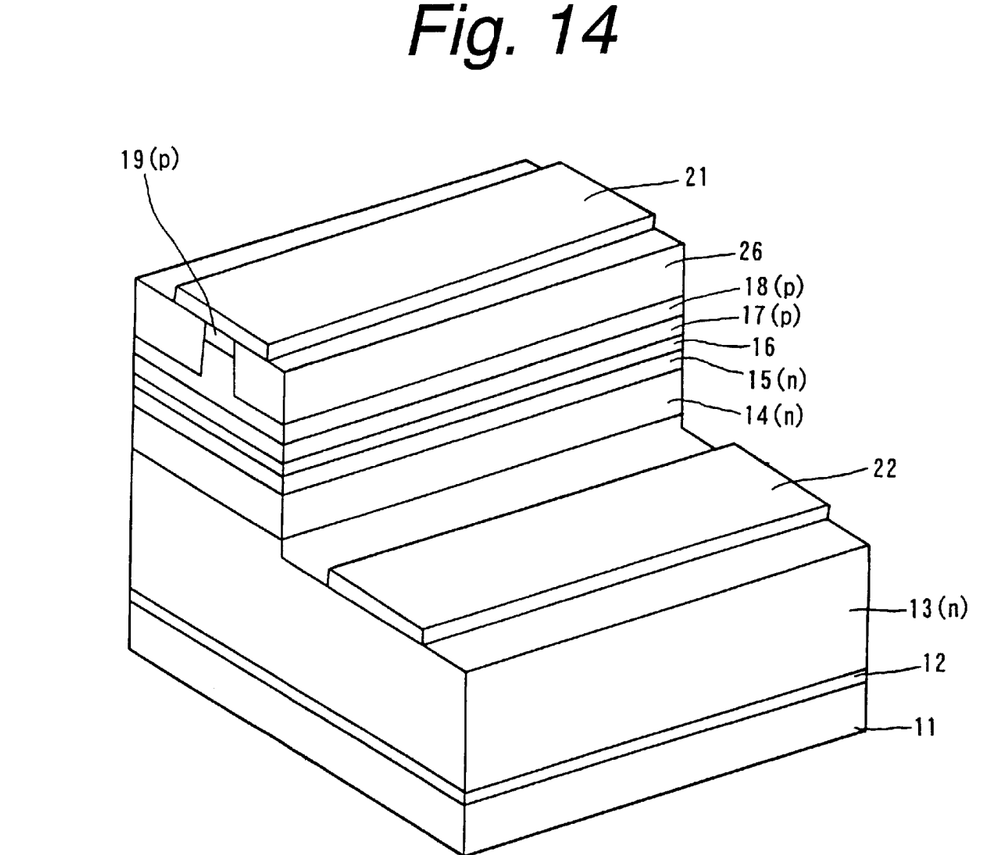
FIG. 14 is a perspective view showing a GaN semiconductor laser having a buried ridge structure according to the third embodiment of the invention.

FIG. 14 shows a GaN semiconductor laser having a buried ridge structure according to the third embodiment of the invention. Here again, the GaN semiconductor laser has a SCH structure.

As shown in FIG. 14, in the GaN semiconductor laser according to the third embodiment, a $(Al_x Ga_{1-x})_y In_{1-y} P$ buried layer 26 is buried at opposite sides of the ridge portion. Here is $0 \leq x \leq 1$ and $0 \leq y \leq 1$. The $(Al_x Ga_{1-x})_y In_{1-y} P$ buried layer 26 is [111]-oriented. In the other respects, the GaN semiconductor laser shown here is the same as the first embodiment, and explanation thereof is omitted.

The GaN semiconductor laser according to the third embodiment can be manufactured by substantially the same manufacturing method used for manufacturing the GaN semiconductor laser according to the first embodiment, except that the $(Al_x Ga_{1-x})_y In_{1-y} P$ buried layer 26 is grown at a growth temperature of 500° C. through 800° C. Used here as source materials for growth of the $(Al_x Ga_{1-x})_y In_{1-y}$ buried layer 26 are, for example, trimethyl aluminum (($CH_3)_3$Al, TMA) as the source material of a group III element, Al, trimethyl gallium (($CH_3)_3$Ga, TMG) as the source material of a group III element, Ga, trimethyl indium (($CH_3)_3$In, TMI) as the source material of a group III element, and phosphine ($PH_3$) as the source material of a group V element, P.

According to the third embodiment, since the contact area between the p-side electrode 21 and the underlying semiconductor layer can be increased by burying the ridge with the $(Al_x Ga_{1-x})_y In_{1-y} P$ buried layer 26, it is possible to promote dissipation of heat generated during operation, like the first embodiment, thereby prevent an increase of the current while the power is supplied, and increase the lifetime of the semiconductor laser. Additionally, since the growth temperature of the $(Al_x Ga_{1-x})_y In_{1-y} P$ buried layer 26 is lower than the growth temperature of the active layer 16, the active layer 16 is not adversely affected by heat upon the growth of the $(Al_x Ga_{1-x})_y In_{1-y} P$ buried layer 26. Furthermore, since the band gap of the $(Al_x Ga_{1-x})_y In_{1-y} P$ buried layer 26 is smaller than that of the active layer 16, the $(A_x Ga_{1-x})_y In_{1-y} P$ buried layer 26 functions as a light absorbing layer. Therefore, this semiconductor laser forms a loss-guided semiconductor laser stable in transverse modes, and can suppress higher mode oscillation upon a high output power, especially because the difference in refractive index between the ridge portion and its outside portion can be controlled more easily by changing the composition of the $(A_x Ga_{1-x})_y In_{1-y} P$ buried layer 26. The third embodiment is the same as the first embodiment also in enabling activation of p-type impurities in p-type layers during growth of the $(Al_xGa_{1-x})_yIn_{1-y}P$ buried layer 26 without the need for post-annealing.

Figure 15:
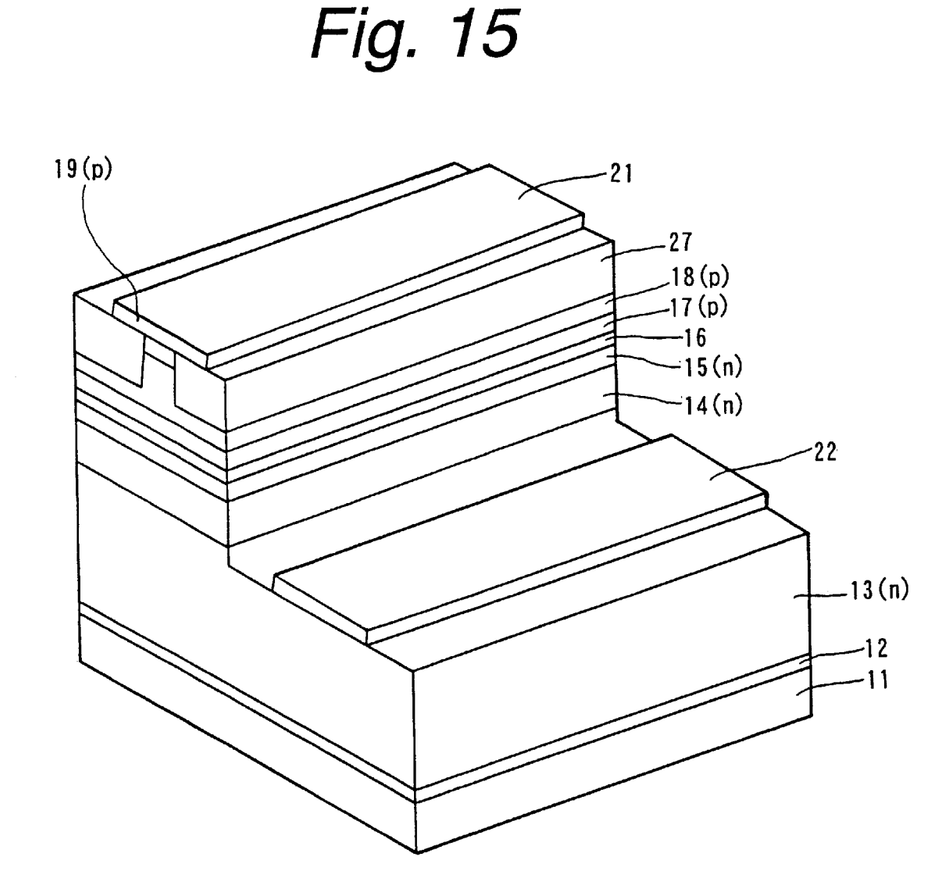
FIG. 15 is a perspective view showing a GaN semiconductor laser having a buried ridge structure according to the fourth embodiment of the. invention.

FIG. 15 shows a GaN semiconductor laser having a buried ridge structure according to the fourth embodiment of the invention. Here again, the GaN semiconductor laser has a SCH structure.

As shown in FIG. 15, in the GaN semiconductor laser according to the fourth embodiment, a $Zn_xMg_{1-x}S_ySe_{1-y}$ buried layer 27 is buried at opposite sides of the ridge portion. Here is $0 \leq x \leq 1$ and $0 \leq y \leq 1$. The $Zn_xMg_{1-x}S_ySe_{1-y}$ buried layer 27 is [111]-oriented. In the other respects, the GaN semiconductor laser shown here is the same as the first embodiment, and explanation thereof is omitted.

The GaN semiconductor laser according to the fourth embodiment can be manufactured by substantially the same manufacturing method used for manufacturing the GaN semiconductor laser according to the first embodiment, except that the $Zn_xMg_{1-x}S_ySe_{1-y}$ buried layer 27 is grown at a growth temperature of 300° C. through 600° C. by MOCVD. Used here as source materials for growth of the $Zn_xMg_{1-x}S_ySe_{1-y}$ buried layer 27 are, for example, dimethyl zinc (DMZn) as the source material of a group II element, Zn, bis-methyl cyclopentadienile magnesium $((CH_3C_5H_4)_2Mg)$ or bis-cyclopentadienile magnesium $((C_5H_5)_2Mg)$ as the source material of a group II element, Mg, diethyl phosphine (DES) as the source material of a group VI element, S, and dimethyl selenium (DMSe) as the source material of a group VI element, Se.

According to the fourth embodiment, since the contact area between the p-side electrode 21 and the underlying semiconductor layer can be increased by burying the ridge with the $Zn_xMg_{1-x}S_ySe_{1-y}$ buried layer 27, it is possible to promote dissipation of heat generated during operation, like the first embodiment, thereby prevent an increase of the current while the power is supplied, and increase the lifetime of the semiconductor laser. Additionally, since the growth temperature of the $Zn_xMg_{1-x}S_ySe_{1-y}$ buried layer 27 is lower than the growth temperature of the active layer 16, the active layer 16 is not adversely affected by heat upon the growth of the $Zn_{xMg1-x}S_ySe_{1-y}$ buried layer 27. Furthermore, since the band gap of the $Zn_xMg_{1-x}S_ySe_{1-y}$ buried layer 27 is smaller than that of the active layer 16, the $Zn_xMg_{1-x}S_ySe_{1-y}$ buried layer 27 functions as a light absorbing layer. Therefore, this semiconductor laser forms a loss-guided semiconductor laser stable in transverse modes, and can suppress higher mode oscillation upon a high output power, especially because the difference in refractive index between the ridge portion and its outside portion can be controlled more easily by changing the composition of the $Zn_xMg_{1-x}S_ySe_{1-y}$ buried layer 27. The fourth embodiment is the same as the first embodiment also in enabling activation of p-type impurities in p-type layers during growth of the $Zn_xMg_{1-x}S_ySe_{1-y}$ buried layer 27 without the need for post-annealing.

Having described specific preferred embodiments of the present invention with reference to the accompanying drawings, it is to be understood that the inventions are not limited to those precise embodiments, and that various changes and modifications may be effected therein by one skilled in the art without departing from the scope or the spirit of the invention as defined in the appended claims.

For example, the numerical values, structures, substrates, source materials and processes proposed with reference to the first to fourth embodiments are not but examples, and any other appropriate numerical values, structures, substrates, source materials and processes may be used.

In the first to fourth embodiments, the ridge stripe has been explained as extending in the <11–20> direction of the c-plane sapphire substrate 1, but it may extend in the <1–100> direction, instead.

Although the first to fourth embodiments have been explained as using the c-plane sapphire substrate as the substrate, any of a SiC substrate, Si substrate and spinel substrate is usable if so desired.

The first to fourth embodiments have been explained as applying the invention to SCH-structured GaN semiconductor lasers; however, the invention is also applicable, needless to say, to GaN semiconductor lasers having a DH (double heterostructure) configuration, and also to electron transport devices such as FET, which use nitride III-V compound semiconductors.

The semiconductor laser proposed according to the invention, in which opposite sides of the ridge-shaped stripe are buried with the buried semiconductor layer made of $Al_xGa_{1-x}As$ $(0 \leq x \leq 1)$, $(Al_xGa_{1-x})_yIn_{1-y}P$ $(0 \leq x \leq 1, 0 \leq y \leq 1)$ or $Zn_xMg_{1-x}S_ySe_{1-y}$ $(0 \leq x \leq 1, 0 \leq y \leq 1)$, can stably control transverse modes and thereby minimize higher-mode oscillation upon a high output power, and it is excellent in heat dissipation.

The manufacturing method of a semiconductor laser according to the invention can readily manufacture the above-mentioned semiconductor laser by making a ridge-shaped stripe and growing a buried semiconductor layer made of $Al_xGa_{1-x}As$ $(0 \leq x \leq 1)$, $(Al_xGa_{1-x})_yIn_{1-y}P$ $(0 \leq x \leq 1, 0 \leq y \leq 1)$ or $Zn_xMg_{1-x}S_ySe_{1-y}$ $(0 \leq x \leq 1, 0 \leq y \leq 1)$ to bury opposite sides of the ridge-shaped stripe. Especially when using metal organic chemnical vapor deposition for growth of the buried semiconductor layer made of $Al_xGa_{1-x}As$ $(0 \leq x \leq 1)$, $(Al_xGa_{1-x})_yIn_{1-y}P$ $(0 \leq x \leq 1, 0 \leq y \leq 1)$ or $Zn_xMg_{1-x}S_ySe_{1-y}$ $(0 \leq x \leq 1, 0 \leq y \leq 1)$, since selective growth is possible, the semiconductor laser can be manufactured more easily. Moreover, by burying the buried semiconductor layer at a lower growth temperature than the growth temperature of the active layer, thermal deterioration of the active layer can be prevented, and a semiconductor laser having a long lifetime can be manufactured.

The semiconductor device according to the invention, in which the portion around the projection is buried with the buried semiconductor layer made of $Al_xGa_{1-x}As$ $(0 \leq x \leq 1)$, $(Al_xGa_{1-y})_yIn_{1-y}P$ $(0 \leq x \leq 1, 0 \leq y \leq 1)$ or $Zn_xMg_{1-x}S_ySe_{1-y}$ $(0 \leq x \leq 1, 0 \leq y \leq 1)$, in the case where the projection becomes a heat generating source, heat dissipation from the ridge portion is promoted, and this minimizes deterioration of the device and elongates the lifetime of the semiconductor device.

The manufacturing method of a semiconductor device according to the invention can readily manufacture the above-mentioned semiconductor device. Especially when using metal organic chemical vapor deposition for growth of the buried semiconductor layer, selective growth is possible, and the semiconductor device can be manufactured more easily.

What is claimed is:

1. A semiconductor laser having a ridge-shaped stripe and made by using nitride III-V compound semiconductors, comprising:

a buried layer made of $Al_xGa_{1-x}As$ $(0 \leq x \leq 1)$ to bury opposite sides of said ridge-shaped stripe.

2. The semiconductor laser according to claim 1 wherein said buried semiconductor layer made of $Al_xGa_{1-x}As$ $(0 \leq x \leq 1)$ is [111]-oriented.

3. A semiconductor laser having a ridge-shaped stripe and made by using nitride III-V compound semiconductors, comprising:

a buried layer made of $(Al_xGa_{1-x})_yIn_{1-y}P$ ($0 \leq x \leq 1$, $0 \leq y \leq 1$) to bury opposite sides of said ridge-shaped stripe.

4. The semiconductor laser according to claim 3 wherein said buried semiconductor layer made of $(Al_xGa_{1-x})_yIn_{1-y}P$ ($0 \leq x \leq 1$, $0 \leq y \leq 1$) is [111]-oriented.

5. A semiconductor laser having a ridge-shaped stripe and made by using nitride III-V compound semiconductors, comprising:

a buried layer made of $Zn_xMg_{1-x}S_ySe_{1-y}$ ($0 \leq x \leq 1$, $0 \leq y \leq 1$) to bury opposite sides of said ridge-shaped stripe.

6. The semiconductor laser according to claim 5 wherein said buried semiconductor layer made of $Zn_xMg_{1-x}S_ySe_{1-y}$ ($0 \leq x \leq 1$, $0 \leq y \leq 1$) is [111]-oriented.

7. A semiconductor device having a projection on a nitride III-V compound semiconductor base body, comprising:

a buried semiconductor layer made of $Al_xGa_{1-x}As$ ($0 \leq x \leq 1$) to bury a portion around said projection.

8. The semiconductor device according to claim 7 wherein said buried semiconductor layer made of $Al_xGa_{1-x}As$ ($0 \leq x \leq 1$) is [111]-oriented.

9. A semiconductor device having a projection on a nitride III-V compound semiconductor base body, comprising:

a buried semiconductor layer made of $(Al_xGa_{1-x})_yIn_{1-y}P$ ($0 \leq x \leq 1$, $0 \leq y \leq 1$) to bury a portion around said projection.

10. The semiconductor device according to claim 9 wherein said buried semiconductor layer made of $(Al_xGa_{1-x})_yIn_{1-y}P$ ($0 \leq x \leq 1$, $0 \leq y \leq 1$) is [111]-oriented.

11. A semiconductor device having a projection on a nitride III-V compound semiconductor base body, comprising:

a buried semiconductor layer made of $Zn_xMg_{1-x}S_ySe_{1-y}$ ($0 \leq x \leq 1$, $0 \leq y \leq 1$) to bury a portion around said projection.

12. The semiconductor device according to claim 11 wherein said buried semiconductor layer made of $Zn_xMg_{1-x}S_ySe_{1-y}$ ($0 \leq x \leq 1$, $0 \leq y \leq 1$) is [111]-oriented.

* * * * *